(12) United States Patent
Xu et al.

(10) Patent No.: US 7,915,112 B2
(45) Date of Patent: Mar. 29, 2011

(54) METAL GATE STRESS FILM FOR MOBILITY ENHANCEMENT IN FINFET DEVICE

(75) Inventors: Jeff J. Xu, Jhubei (TW); Clement H. Wann, Carmel, NY (US); Chi Chieh Yeh, Taipei (TW); Chi-Sheng Chang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 15 days.

(21) Appl. No.: 12/236,115

(22) Filed: Sep. 23, 2008

(65) Prior Publication Data
US 2010/0072553 A1    Mar. 25, 2010

(51) Int. Cl.
*H01L 21/8238* (2006.01)

(52) U.S. Cl. ........ 438/199; 438/153; 438/154; 257/369; 257/E21.632

(58) Field of Classification Search .................. 257/369, 257/E21.632, E27.062
See application file for complete search history.

(56) References Cited

U.S. PATENT DOCUMENTS

| | | | |
|---|---|---|---|
| 6,706,571 B1 | 3/2004 | Yu et al. | |
| 6,858,478 B2 | 2/2005 | Chau et al. | |
| 7,190,050 B2 | 3/2007 | King et al. | |
| 7,247,887 B2 | 7/2007 | King et al. | |
| 7,265,008 B2 | 9/2007 | King et al. | |
| 7,508,031 B2 | 3/2009 | Liu et al. | |
| 7,528,465 B2 | 5/2009 | King et al. | |
| 7,605,449 B2 | 10/2009 | Liu et al. | |
| 2005/0153490 A1 | 7/2005 | Yoon et al. | |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2007/0190708 A1 | 8/2007 | Kaneko et al. | |
| 2008/0237719 A1* | 10/2008 | Doyle et al. | 257/351 |
| 2008/0290470 A1 | 11/2008 | King et al. | |
| 2008/0296632 A1 | 12/2008 | Moroz et al. | |
| 2008/0296681 A1* | 12/2008 | Georgakos et al. | 257/347 |
| 2009/0181477 A1 | 7/2009 | King et al. | |

OTHER PUBLICATIONS

Chang Yong Kang, et al. Article: Effects of Film Modulation Using TiN Metal Gate on Stress Engineering and Its Impact on Device Characteristics in Metal Gate/High-k Dielectric SOI FinFETs. Journal: IEEE Electron Device Letters, vol. 29, No. 5, May 2008, pp. 487-490. ISSN: 0741-3106.

Official Action issued Oct. 21, 2010 in counterpart Taiwan application.

* cited by examiner

*Primary Examiner* — N Drew Richards
*Assistant Examiner* — Mamadou Diallo
(74) *Attorney, Agent, or Firm* — Duane Morris LLP (57) ABSTRACT

A CMOS FinFET semiconductor device provides an NMOS FinFET device that includes a compressive stress metal gate layer over semiconductor fins and a PMOS FinFET device that includes a tensile stress metal gate layer over semiconductor fins. A process for forming the same includes a selective annealing process that selectively converts a compressive metal gate film formed over the PMOS device to the tensile stress metal gate film.

20 Claims, 9 Drawing Sheets

METAL GATE STRESS FILM FOR MOBILITY ENHANCEMENT IN FINFET DEVICE

FIELD OF THE INVENTION

The present invention relates, most generally, to semiconductor devices and methods for manufacturing the same. More particularly, the present invention relates to FinFET logic devices, other CMOS devices and methods for manufacturing the same.

BACKGROUND

In the rapidly advancing semiconductor manufacturing industry, CMOS, complimentary metal oxide semiconductor, FinFET devices are favored for many logic and other applications and are integrated into various different types of semiconductor devices. FinFET devices typically include semiconductor fins with high aspect ratios and in which channel and source/drain regions of semiconductor transistor devices are formed. A gate is formed over and along the sides of the fin devices utilizing the advantage of the increased surface area of the channel and source/drain regions to produce faster, more reliable and better-controlled semiconductor transistor devices.

In FinFET and conventional planar transistor devices, it is widely known that a compressive strain applied to a PMOS device advantageously enhances hole mobility and that tensile strain applied to NMOS devices advantageously enhances electron mobility in the NMOS device. For planar CMOS devices, complex stressors such as selective SiGe source/drain structures are used to enhances hole mobility in PMOS devices and tensile contact etch stop layers, CESL, or other dielectric film stressors are used to enhance electron mobility for NMOS devices to enhance overall device performance. The additional processing operations and costs associated with these techniques for enhancing hole and electron mobility are among the shortcomings associated with attempting to integrate these techniques into FinFET processing schemes. Furthermore, known stressors such as nitride-caps are not applicable to highly integrated FinFET devices which may include fins that are spaced apart by as little as 25 nm, such spacings producing trenches with high aspect ratios, and also due to increased parasitic capacitance issues stemming from the high-dielectric constant of the nitride film.

It would therefore be desirable to enhance device performance of FinFET devices by applying appropriate compressive and tensile stresses to NMOS and PMOS FinFET devices, respectively, using techniques compatible with the requirements of advanced FinFET processing such as may utilize tightly packed fins.

SUMMARY OF THE INVENTION

To address these and other needs and in view of its purposes, the present invention provides a method for forming a CMOS device. The method includes forming NMOS and PMOS regions on a substrate, forming a compressive PVD metal layer over the NMOS and PMOS regions, selectively converting only the compressive PVD metal layer formed in the PMOS region to a tensile metal layer and forming gate electrodes over the NMOS and PMOS regions including over the compressive PVD metal layer in the NMOS region and over the tensile metal layer in the PMOS region. Advantageously, in an embodiment in which the CMOS devices are FinFET devices, the method may include forming a plurality of semiconductor fins in each of the NMOS and PMOS regions and forming the PVD metal layer over the semiconductor fins.

According to another aspect, provided is a further method for forming a CMOS FinFET device. The method includes forming semiconductor fins in NMOS and PMOS regions over a substrate, forming dummy gates over a sacrificial film over the semiconductor fins in each of the NMOS and PMOS regions, performing source/drain implants in each of the NMOS and PMOS regions and depositing a dielectric over the semiconductor fins and dummy gates. The method further provides for planarizing the dielectric to expose surfaces of the dummy gates in both the NMOS and PMOS regions, selectively removing the dummy gates from the PMOS region but not the NMOS region and depositing a high-k gate dielectric on the semiconductor fins in the PMOS region. The method further provides for using physical vapor deposition techniques to deposit a first compressive metal film on the fins in the PMOS region. The method then provides for heating thereby converting the first compressive metal film to a tensile stress metal film and forming functional gates over the fins in the PMOS region.

The method additionally provides for next removing the dummy gates from over the NMOS region and depositing a high-k dielectric material on the fins in the NMOS region and a second compressive metal film using PVD techniques, on the fins in the NMOS region. The method further provides for forming functional polysilicon or metal gates over the compressive metal film and the fins in the NMOS region, with the second compressive film retaining compressive characteristics, wherein the functional gates are formed of polysilicon.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

FIGS. 1A, 1B through 9A, 9B represent a sequence of processing operations that illustrate an exemplary method of the present invention. With respect to each set of figures, the A-suffix figure represents a perspective view of the processing operation and the B-suffix figure represents a cross-sectional side view taken along line B-B of the corresponding A-suffix figure.

DETAILED DESCRIPTION

The present invention provides a sequence of process operations that effectively generates compressive and tensile stresses on NMOS and PMOS FinFET devices, respectively, by manipulating mechanical properties, in particular the stress characteristics, of thin metal gates to enhance both electron and hole mobility. The methods and structure of the invention can be used on planar devices or FinFET devices formed on closely spaced fins, i.e., fins with high aspect ratios that are spaced apart by about 25 nm or less, and can be understood according to the following illustrated exemplary sequence of processing operations carried out to produce FinFET devices.

Figure 1A:
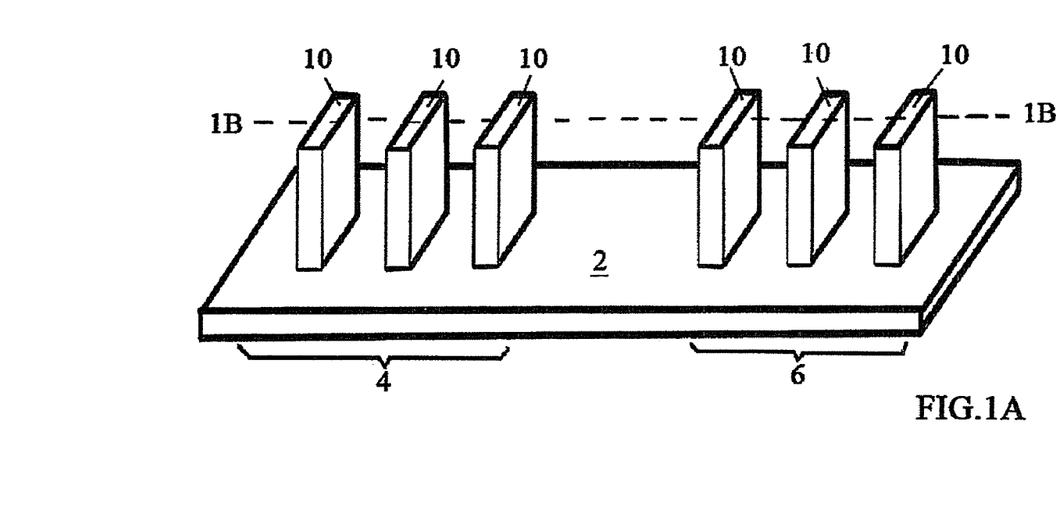
FIGS. 1A, 1B illustrate a plurality of semiconductor fins formed in NMOS and PMOS regions.
Figure 1B:
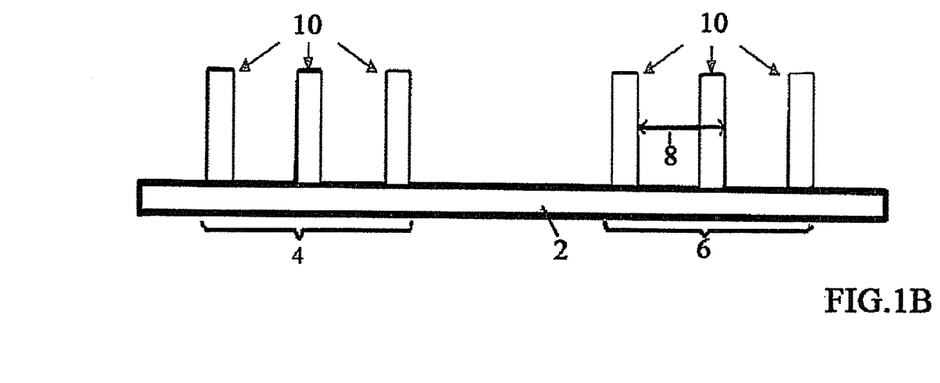

FIGS. 1A, 1B show substrate 2 having PMOS region 4 and NMOS region 6. In each of PMOS region 4 and NMOS region 6 are fins 10. Fins 10 may be formed of silicon, silicon-germanium (SiGe), Ge, various group III-IV compound semiconductors or other suitable semiconductor materials used for fins in FinFET devices. Fins 10 may include a spacing between adjacent fins 10 of about 25 nm or less, and fins 10 may include a pitch 8 of about 35 nm or less. Other spacings and pitches may be used in other exemplary embodiments. Substrate 2 may be a silicon substrate, an SOI (silicon on insulator) substrate or various other suitable substrates used in the semiconductor manufacturing industry. Fins 10 may be formed using various suitable methods available in the art, such as SDPT, spacer double patterning technique.

Figure 2A:
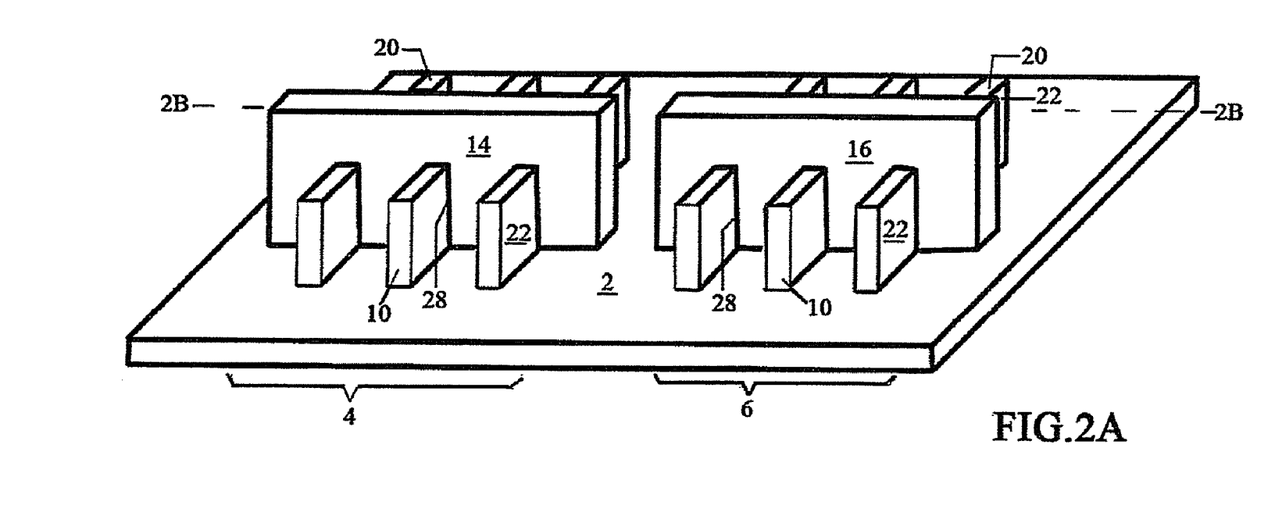
FIGS. 2A, 2B show dummy gates formed over the structures shown in FIGS. 1A, 1B.
Figure 2B:
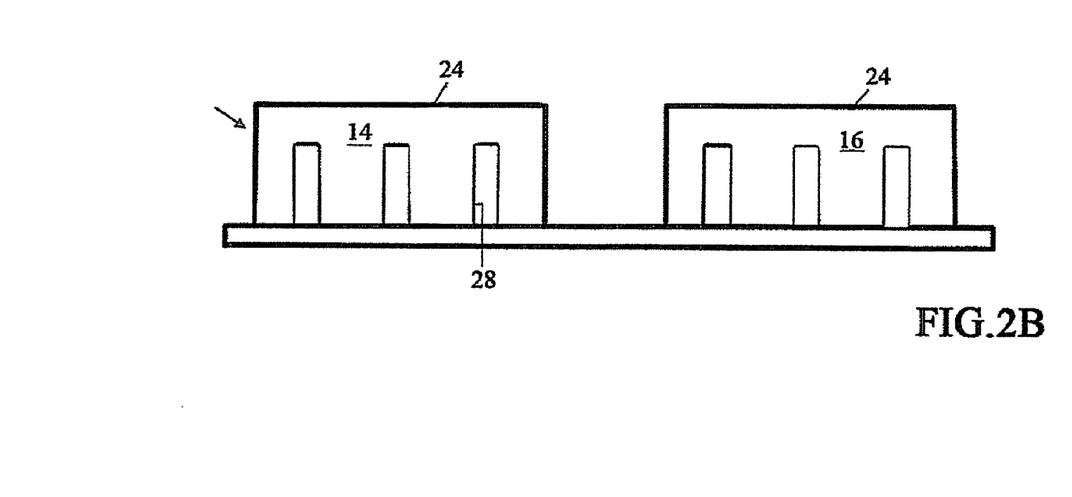

FIGS. 2A, 2B illustrate dummy gates formed over fins 10 in each of PMOS region 4 and NMOS region 6. In PMOS region 4, dummy fin 14 is formed over top 20 and along sides 22 of fins 10. In NMOS region 6, gate 16 is formed over top 20 and along sides 22 of fins 10. Conventional methods may be used to form and pattern dummy gates 14, 16. Dummy gates 14, 16 may be formed of polysilicon but other suitable semiconductor materials may be used in other exemplary embodiments. Along interface 28 between the surfaces of fin 10 and the respective dummy gate, a sacrificial layer may be formed to act as an etch stop layer for when the dummy gate 14, 16 is removed from over fin 10. The inclusion of such an etch stop layer is especially useful according to the example in which fin 10 and dummy gates 14, 16 are formed of similar or the same material such as silicon. According to such exemplary embodiment, an oxide sacrificial layer may be used.

At this illustrated point in the processing sequence, source/drain implant operations may take place in either or both of PMOS region 4 and NMOS region 6. Conventional methods may be used. The source/drain implants may be followed by a conventional annealing process such as a spike or laser anneal that may take place at a maximum temperature ranging from about 900° C. to about 1200° C., but other annealing methods may be used in other exemplary embodiments. The spike or laser anneal time may range from 1 millisecond to 1 second in various embodiments, but other times may be used in other exemplary embodiments. Dummy gates 14, 16 each include upper surface 24.

Figure 3A:
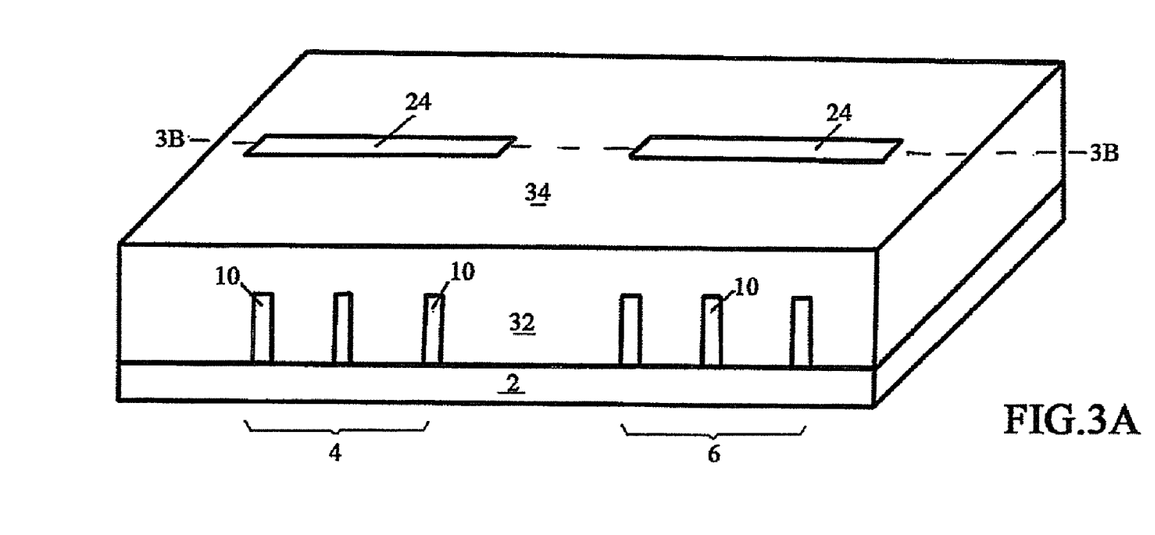
FIGS. 3A, 3B show a dielectric formed over the structure shown in FIGS. 2A, 2B.
Figure 3B:
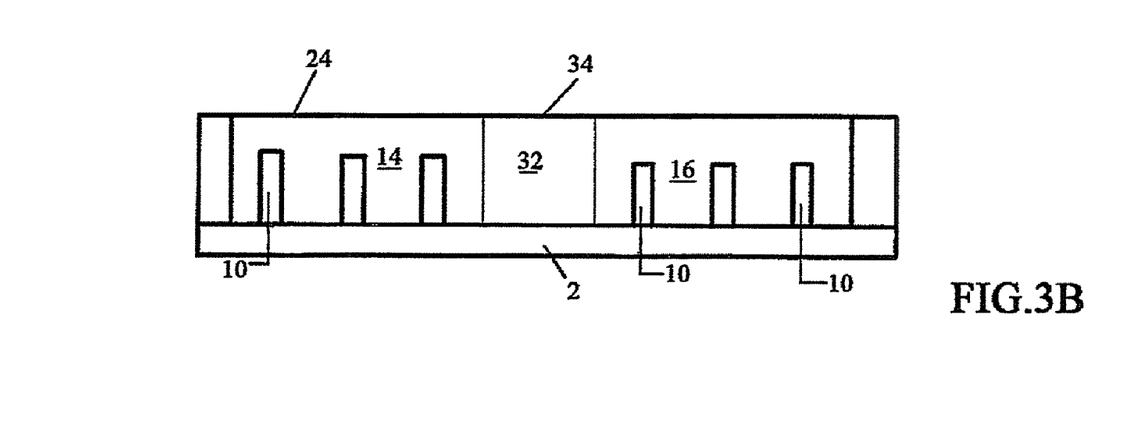

Now turning to FIGS. 3A, 3B, a pre-metal dielectric, PMD, is formed over the structure shown in FIGS. 2A, 2B, then planarized to produce dielectric 32 having top surface 34 being coplanar with upper surfaces 24 of dummy gates 14,16. Conventional deposition and polishing/planarization techniques such as chemical mechanical polishing, CMP, may be used.

Figure 4A:
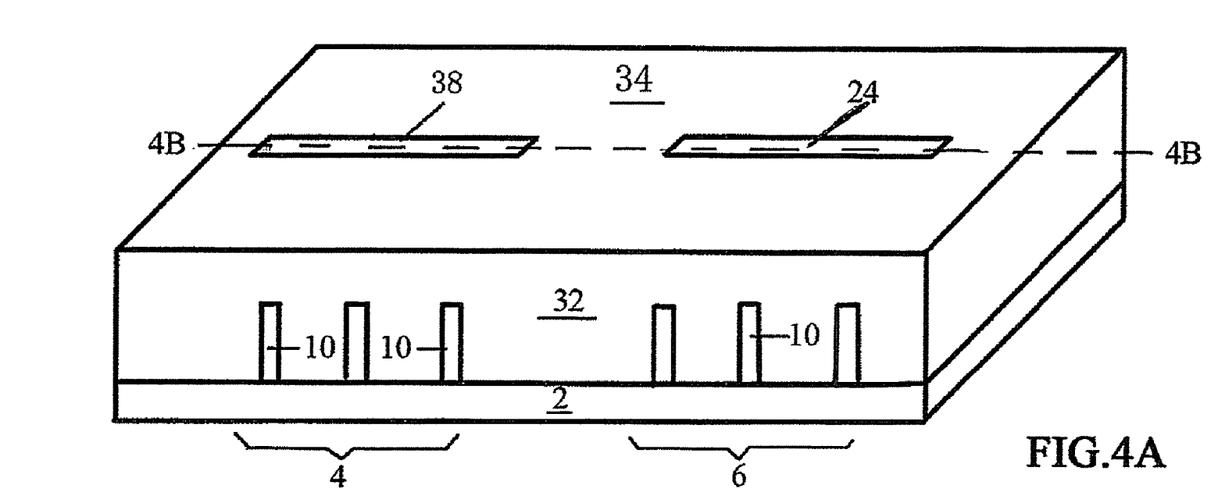
FIGS. 4A, 4B illustrate the selective removal of the PMOS dummy gate from the structure shown in FIGS. 3A, 3B.
Figure 4B:
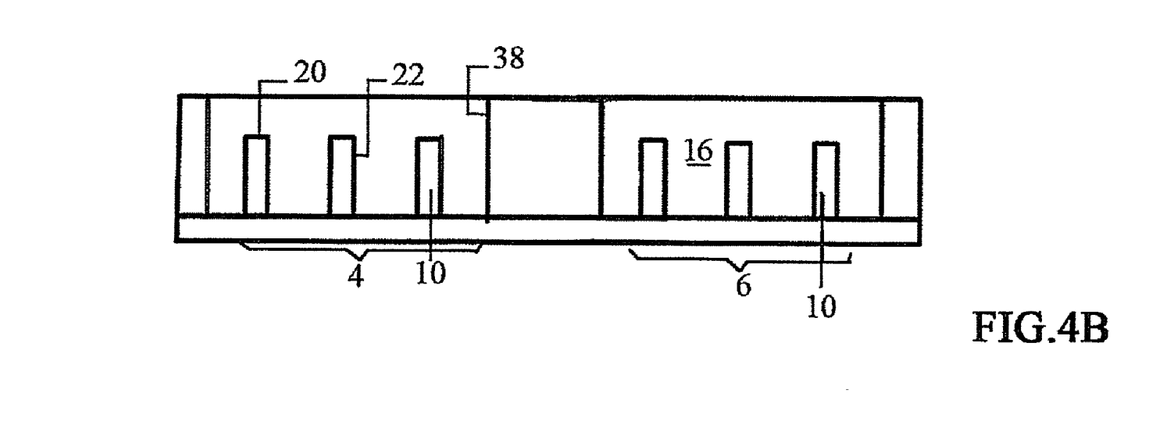

Conventional patterning and etching techniques may then be used to selectively remove dummy gate 14 from PMOS region 4 such as shown in FIGS. 4A, 4B. Opening 38 is created within dielectric 32 and exposes top surface 20 and sidewalls 22 of fins 10 in PMOS region 4 after any optional sacrificial layer that serves as an etch stop layer has been removed. Dummy gate 16 remains intact in NMOS region 6.

Figure 5A:
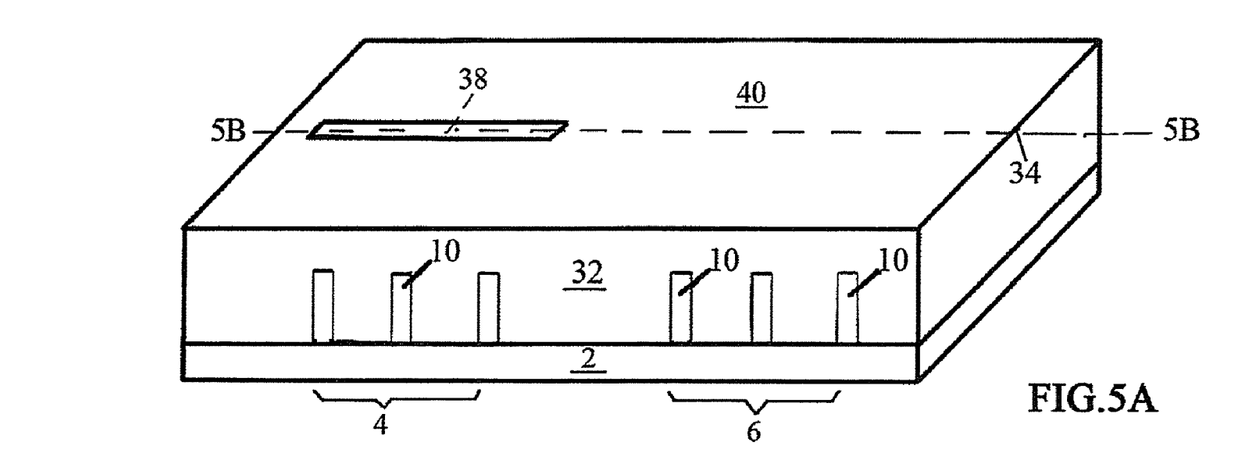
FIGS. 5A, 5B illustrate a high-k gate dielectric and metal gate film formed over the semiconductor fins in the PMOS region.
Figure 5B:
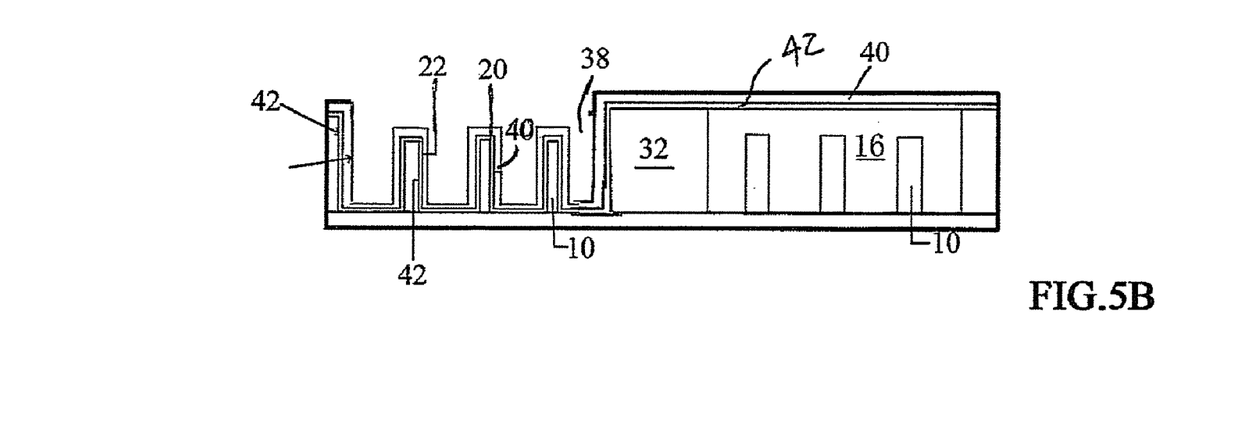

FIGS. 5A, 5B show the structure of FIGS. 4A, 4B after a high-k dielectric and a PVD metal film have been formed. Conventional methods may be used to form high-k dielectric film 42 and metal film 40 over top surface 34 of dielectric 32 and also within opening 38, in particular on top 20 and sides 22 of fins 10 in PMOS region 4.

High-k dielectric film 42 may be various suitable films such as aluminum oxide, tantalum pentoxide, lanthanum oxide, gadolinium oxide, yttrium oxide, hafnium oxide, zirconium oxide, HfSiON, HfAlO and LaAlO$_3$, but other suitable high-k dielectrics may be used in other exemplary embodiments. Metal film 40 may be formed using physical vapor deposition, but other conventional deposition techniques may be used. For metal film 40 formed in PMOS region 4, suitable candidates for metal film 40 may be Co, Pd, Ni, Re, Ir, Ru and Pt. In other exemplary embodiments, metal alloys such as Ru—Ta, Ru—Zr, Pt—Hf, Pt—Ti, Co—Ni and Ni—Ta may be used and in yet other exemplary embodiments, metal nitrides such as WNx, WN$_x$, TiN$_x$, MoN$_x$, TaN$_x$ and TaSi$_x$N$_y$, or metal oxides such as In$_2$O$_3$, SnO$_2$, OsO$_2$, RuO$_2$, IrO$_2$, ZnO, MoO$_2$ and ReO$_2$ may be used. As deposited using physical vapor deposition techniques, metal film 40 is compressive in nature and may include a compressive stress of about (−)10 GPa post-deposition, but various ranges of compressive stresses may be produced in other exemplary embodiments.

According to one exemplary embodiment, metal film 40 may include a thickness ranging from 3-5 nanometers, but other thicknesses may be used in other exemplary embodiments.

After deposition, a heating procedure is then used to convert the as-deposited compressive metal film 40 to a tensile metal film. According to one exemplary embodiment, a spike anneal at about 1050° C. may be used to convert metal film 40 from being compressive to being tensile in nature. Other temperatures within the range of about 900° C. to about 1300° C. may be used in other exemplary embodiments and the duration of the spike anneal may vary from 1 millisecond to several seconds in various exemplary embodiments. Other conventional heating methods such as a laser anneal, may alternatively be used. According to yet another exemplary embodiment, a conventional furnace or convection anneal may be used.

After being converted to a tensile film, metal layer 40 may include a tensile stress greater than about 4 GPa, but other tensile stress values may be produced according to other exemplary embodiments.

Figure 6A:
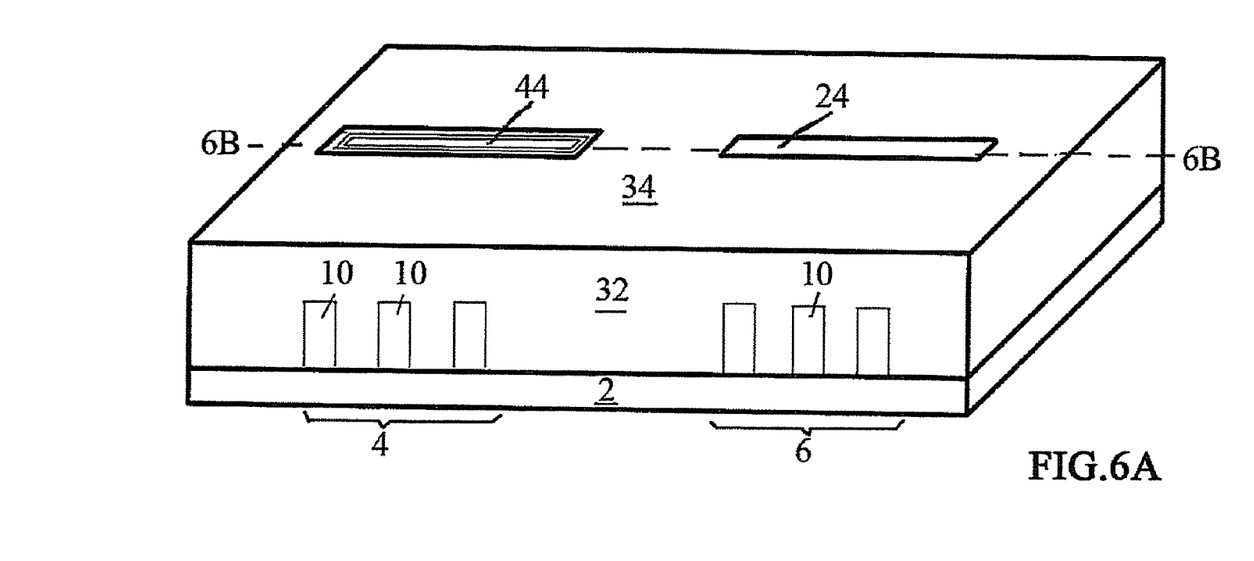
FIGS. 6A, 6B illustrate a functional gate formed over the fins in the PMOS region.
Figure 6B:
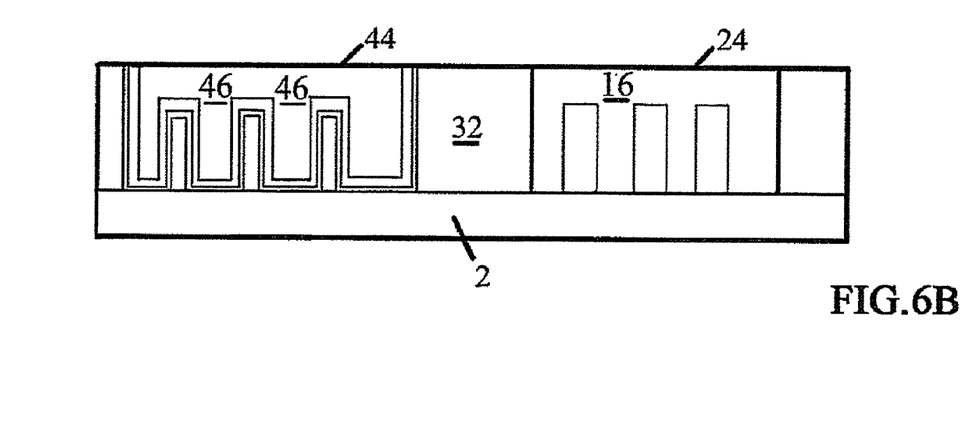

FIGS. 6A, 6B show the structure of FIGS. 5A, 5B, after PMOS gate 46 has been formed over metal film 40 and high-k dielectric film 42 formed over of fins 10 in PMOS region 4. PMOS gate 46 is a functional gate, i.e. it will remain and eventually be used to control the devices utilizing fins 10. PMOS gate 46 may be formed of metal or silicon such as polysilicon but other suitable conductive or semiconductive gate materials may be used in other exemplary embodiments. Conventional methods may be used to first form the material used as PMOS gate 46 within opening 38 shown in FIGS. 5A, 5B and over metal film 40 and surface 34 of dielectric 32 and then planarize using conventional polishing and/or planarization techniques to expose top surface 34 of dielectric 32 and produce upper surface 44 of PMOS gate 46. Dummy gate 16 remains in NMOS region 6. The previously described annealing process may be carried out prior to or after deposition of the material used to form PMOS gate 46.

Figure 7A:
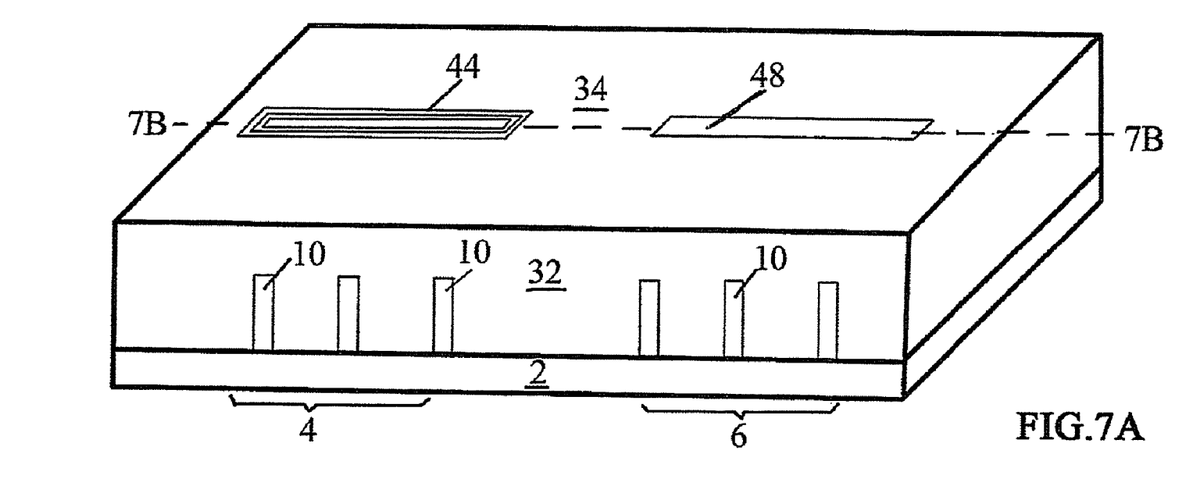
FIGS. 7A, 7B illustrate the selective removal of the dummy gate from the NMOS region.
Figure 7B:
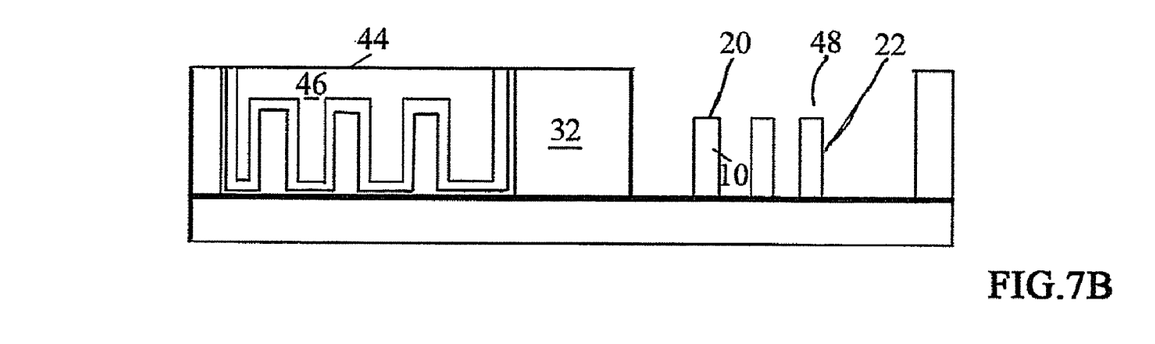

Now turning to FIGS. 7A, 7B, dummy gate 16 is selectively removed from NMOS region 6 using conventional patterning and removal techniques. Such removal results in opening 48 which exposes top 20 and sides 22 of fins 10 in opening 48 within NMOS region 6, after the subsequent removal of any optional sacrificial film used over fins 10 in NMOS region 6.

Figure 8A:
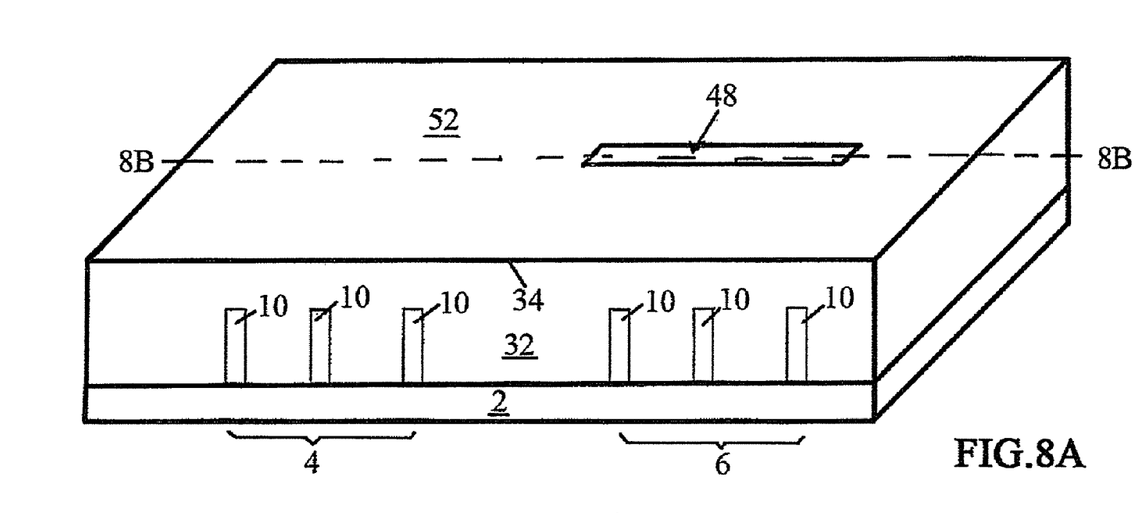
FIGS. 8A, 8B illustrate a high-k dielectric and metal gate deposited over the fins in the NMOS region.
Figure 8B:
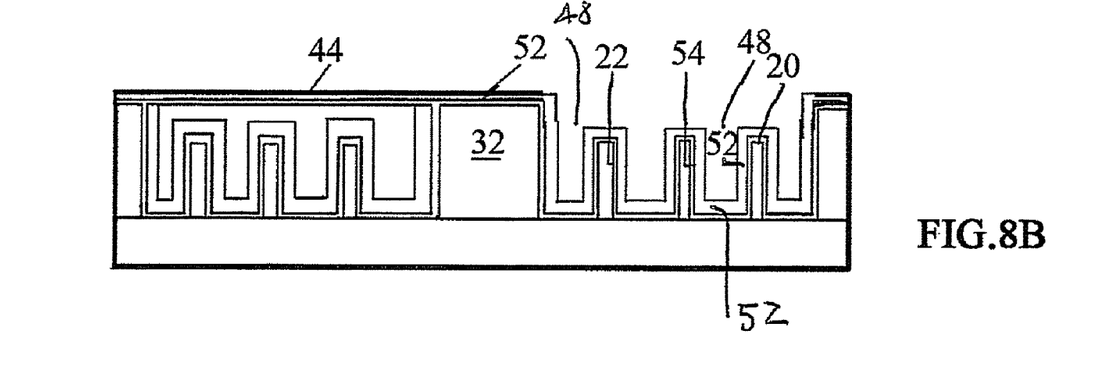

FIGS. 8A, 8B show the structure previously illustrated in FIGS. 7A, 7B after a high-k dielectric and a metal film have been formed. Conventional methods may be used to form high-k dielectric film 54 and metal film 52 over top surface 34 of dielectric 32 and also within opening 48, in particular on top 20 and sides 22 of fins 10 formed in NMOS region 6. Metal film 52 may be as described for metal film 40, supra, and may advantageously be formed using PVD. High-k dielectric film 54 may be as described for high-k dielectric film 42 in conjunction with FIGS. 5A, 5B.

A further heating operation is not carried out and therefore metal film 52 remains compressive in nature and may include a compressive stress of about (−)10 GPa as deposited although various other compressive stresses may be used in other embodiments. The structure of FIG. 8A, 8B undergoes a number of processing operations to produce the structure shown in FIGS. 9A, 9B.

Figure 9A:
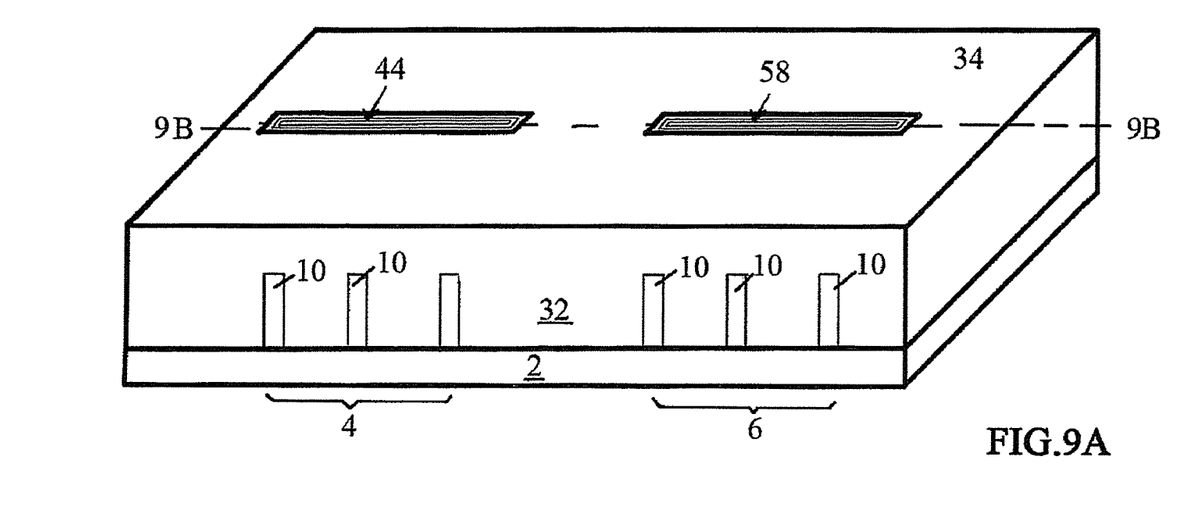
FIGS. 9A, 9B illustrate functional NMOS and PMOS gates as formed.
Figure 9B:
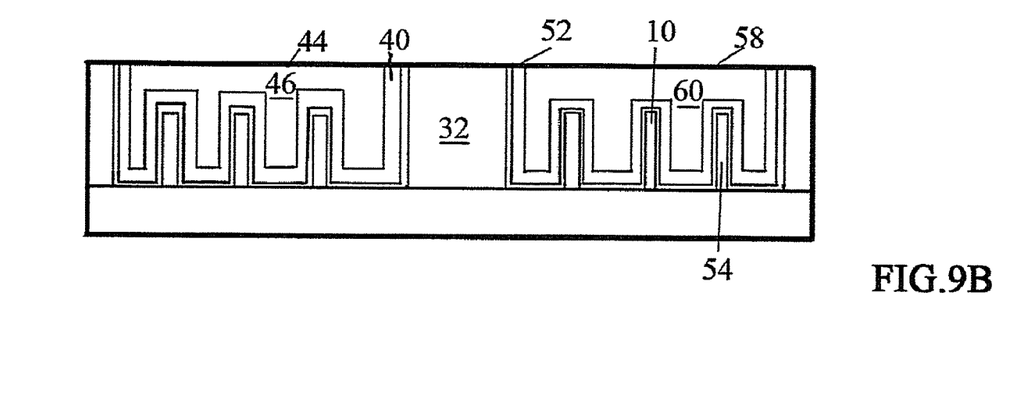

Turning to FIGS. 9A, 9B, conventional deposition techniques are used to deposit a gate material within opening 48 shown in FIGS. 8A, 8B and over metal film 52 shown in FIGS. 8A, 8B. Conventional planarization or polishing techniques such as chemical mechanical polishing are then used to remove the deposited material and metal film 52 and high-k dielectric film 54 from over top surface 34 of dielectric 32 to produce the structure shown in FIGS. 9A, 9B. NMOS gate 60 is formed over fins 10, in particular over high-k dielectric film 54 and metal film 52 formed over fins 10 in NMOS region 6. NMOS gate 60 includes top surface 58 and may be formed with conventional gate material such as polysilicon or aluminum or another metal, or other suitable gate materials. The structure shown in FIGS. 9A, 9B includes metal film 40 which is tensile in nature and metal film 52 which is compressive in nature formed as part of the gate structure in PMOS region 4 and NMOS region 6, respectively.

Various further processing operations may be then carried out upon the structure showing FIGS. 9A, 9B to incorporate the respective gate structures shown in FIGS. 9A, 9B into various integrated circuit and other semiconductor devices. Various techniques for forming interconnect structures may be used to connect top surfaces 44 and 58 to further circuitry. The devices so formed may be used in various applications.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for forming a CMOS FinFET device comprising:
    forming a plurality of NMOS and PMOS regions on a substrate;
    forming a compressive PVD (physical vapor deposition) metal layer over said NMOS and PMOS regions;
    selectively converting said compressive PVD metal layer formed in said PMOS region, to a tensile metal layer; and
    forming gate electrodes overlying said compressive PVD metal layer in said NMOS region and overlying said tensile metal layer in said PMOS region.

2. The method as in claim 1, wherein:
    said forming a plurality of NMOS and PMOS regions comprises forming a plurality of semiconductor fins in each of said NMOS and PMOS regions on said substrate;
    said forming a compressive PVD metal layer comprises forming said compressive PVD metal layer over said semiconductor fins in each of said NMOS and PMOS regions; and
    said forming gate electrodes comprises forming said gate electrodes over said semiconductor fins including over said compressive PVD metal layer in said NMOS region and over said tensile metal layer in said PMOS region.

3. The method as in claim 2, wherein said forming a compressive PVD metal layer comprises forming a TiN layer over said semiconductor fins in each of said NMOS and PMOS regions.

4. The method as in claim 2, wherein said semiconductor fins are formed of silicon or SiGe.

5. The method as in claim 2, wherein said selectively converting comprises said tensile metal layer having a tensile stress of greater than about 4 GPa.

6. The method as in claim 2 further comprising forming a high-k gate dielectric over said semiconductor fins in each of said NMOS and PMOS regions, and wherein said compressive PVD metal layer is disposed over said high-k gate dielectric in each of said NMOS and PMOS regions.

7. The method as in claim 2, wherein said plurality of semiconductor fins have a pitch no greater than about 25 nm and said compressive PVD metal layer comprises TiN having a thickness of about 3-5 nm.

8. The method as in claim 1, wherein said selectively converting comprises spike annealing at a temperature within the range of about 1000° C. to about 1100° C.

9. A method for forming a CMOS FinFET device comprising:
   forming a plurality of NMOS and PMOS regions on a substrate;
   forming a compressive PVD (physical vapor deposition) metal layer over said NMOS and PMOS regions,
   selectively converting said compressive PVD metal layer formed in said PMOS region, to a tensile metal layer; and
   forming gate electrodes overlying said compressive PVD metal layer in said NMOS region and overlying said tensile metal layer in said PMOS region,
   wherein said forming a compressive PVD metal layer comprises separately forming a first compressive PVD metal layer over said PMOS region and a second compressive PVD metal layer over said NMOS region, and wherein said selectively converting comprises performing a spike or laser anneal when said first compressive PVD metal layer is disposed over said PMOS region and when said second compressive PVD metal layer is not present in said NMOS region.

10. The method as in claim 9, wherein said forming a first compressive PVD metal layer over said NMOS region and forming a second compressive PVD metal layer over said PMOS region and said selectively converting comprise:
   forming dummy gates over a sacrificial film over semiconductor fins in each of said NMOS and PMOS regions;
   performing a source/drain implant and a further anneal in at least one of said NMOS and PMOS regions;
   depositing a dielectric over said semiconductor fins and said dummy gates in each of said NMOS and PMOS regions;
   planarizing said dielectric to expose respective surfaces of said dummy gates in each of said NMOS and PMOS regions;
   selectively removing said dummy gate from said PMOS region;
   depositing a high-k gate dielectric on said semiconductor fins in said PMOS region;
   depositing said first compressive PVD metal layer;
   performing said spike or laser anneal thereby selectively converting said first compressive PVD metal layer to said tensile metal film;
   removing said dummy gate from said NMOS region;
   depositing a further high-k dielectric material on said semiconductor fins in said NMOS region;
   depositing said second compressive PVD metal layer; and
   forming polysilicon or metal gates over said tensile metal film and said semiconductor fins in said PMOS region and over said second compressive PVD metal layer in said NMOS region, said second compressive PVD metal layer retaining compressive characteristics.

11. A method for forming a CMOS FinFET device comprising:
   forming semiconductor fins in NMOS and PMOS regions over a substrate;
   forming dummy gates overlying a sacrificial film overlying said semiconductor fins in each of said NMOS and PMOS regions;
   performing a source/drain implant in at least one of said NMOS and PMOS regions;
   depositing a dielectric over said semiconductor fins and said dummy gates;
   planarizing said dielectric to expose surfaces of said dummy gates in each of said NMOS and PMOS regions;
   selectively removing said dummy gates from said PMOS region;
   depositing a high-k gate dielectric on said semiconductor fins in said PMOS region;
   using physical vapor deposition techniques to deposit a first compressive metal film on said fins in said PMOS region;
   heating thereby converting said first compressive metal film to a tensile metal film; and
   forming functional gates over said semiconductor fins in said PMOS region.

12. The method as in claim 11, further comprising, after said forming functional gates in said PMOS region,
   removing said dummy gates from over said NMOS region;
   depositing a further high-k dielectric material on said semiconductor fins in said NMOS region;
   depositing a second compressive metal film using physical vapor deposition techniques on said semiconductor fins in said NMOS region; and
   forming functional gates over said compressive metal film and said fins in said NMOS region with said second compressive metal film retaining compressive characteristics, and
   wherein said functional gates in said PMOS region and said functional gates in said NMOS region each comprise polysilicon or metal gates.

13. The method as in claim 12, wherein each of said first compressive metal film and said second compressive metal film comprises TiN, and said heating comprises a spike or laser anneal at a temperature within the range of about 1000° C. to 1300° C. and whereby said converting produces said tensile metal film having a stress of about 4 GPa or greater.

14. The method as in claim 12, wherein each of said selectively removing said dummy gates from said PMOS region and said removing said dummy gates from over said NMOS region comprise etching and stopping at said sacrificial film.

15. The method as in claim 11, wherein said semiconductor fins are formed of silicon, SiGe, Ge or group III-IV compound semiconductors.

16. A method for forming a CMOS FinFET device comprising:
   forming a plurality of semiconductor fins in each of NMOS and PMOS regions on a substrate;
   forming a compressive PVD (physical vapor deposition) metal layer over said semiconductor fins in each of said NMOS and PMOS regions;
   selectively converting said compressive PVD metal layer formed in said PMOS region, to a tensile metal layer using a spike annealing process; and
   forming gate electrodes overlying said compressive PVD metal layer in said NMOS region and overlying said tensile metal layer in said PMOS region.

17. The method as in claim 16, wherein said forming a compressive PVD metal layer comprises forming a TiN layer over said semiconductor fins in each of said NMOS and PMOS regions and said semiconductor fins are formed of silicon or SiGe.

18. The method as in claim 16, wherein said selectively converting comprises said tensile metal layer having a tensile stress of greater than about 4 GPa.

19. The method as in claim 16, wherein said spike annealing takes place at a temperature within the range of about 1000° C. to about 1100° C.

20. The method as in claim 16 further comprising forming a high-k gate dielectric over said semiconductor fins in each of said NMOS and PMOS regions, and wherein said forming a compressive PVD metal layer comprises forming said PVD metal layer over said high-k gate dielectric in each of said NMOS and PMOS regions.

\* \* \* \* \*